United States Patent
Steimle et al.

(10) Patent No.: US 7,524,719 B2
(45) Date of Patent: Apr. 28, 2009

(54) METHOD OF MAKING SELF-ALIGNED SPLIT GATE MEMORY CELL

(75) Inventors: Robert F. Steimle, Austin, TX (US); Ko-Min Chang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/469,163

(22) Filed: Aug. 31, 2006

(65) Prior Publication Data

US 2008/0121974 A1    May 29, 2008

(51) Int. Cl.
*H01L 21/8238* (2006.01)
(52) U.S. Cl. .................. 438/211; 438/259; 257/E21.68
(58) Field of Classification Search .................. 438/211, 438/257, 259; 257/314, 315, E29.129, E29.3, 257/E21.422, E21.68, E21.687, E21.688
See application file for complete search history.

(56) References Cited

U.S. PATENT DOCUMENTS

| | | | |
|---|---|---|---|
| 5,408,115 A | 4/1995 | Chang | |
| 5,824,584 A | 10/1998 | Chen et al. | |
| 5,969,383 A | 10/1999 | Chang et al. | |
| 6,017,793 A * | 1/2000 | Oyama | 438/258 |
| 6,816,414 B1 * | 11/2004 | Prinz | 365/185.29 |
| 7,046,552 B2 * | 5/2006 | Chen et al. | 365/185.17 |
| 2005/0176202 A1 | 8/2005 | Hisamoto et al. | |

OTHER PUBLICATIONS

U.S. Appl. No. 11/240,240, filed Sep. 30, 2005.
U.S. Appl. No. 11/376,411, filed Mar. 15, 2006.
U.S. Appl. No. 11/376,410, filed Mar. 15, 2006.

* cited by examiner

*Primary Examiner*—Khiem D Nguyen

(57) ABSTRACT

A method for forming a split gate memory cell (10,11) using a semiconductor substrate (12) includes forming a select gate structure (48) and a sacrificial structure (50) over the substrate. An opening is between the select gate structure and the sacrificial structure. The opening is lined with a storage layer (56,168). The opening is further filled with select gate material (58,170). The sacrificial structure is removed after filling the opening with the select gate material.

16 Claims, 12 Drawing Sheets

METHOD OF MAKING SELF-ALIGNED SPLIT GATE MEMORY CELL

BACKGROUND

The present disclosures relate to semiconductor memory devices, and more particularly, to a self-aligned split gate nanocrystal memory cell and method for making the same.

In a prior method of forming a split-gate nanocrystal memory cell device, the method uses a non-self aligned approach to pattern the control and select gates of the device. Since the formation of the control and select gates relies on more than one mask, registration errors occurring during the photolithography steps in the manufacture thereof result in significant variation in the gate length of the device gates. The registration errors and resulting variations in gate length of the device gates are highly undesirable.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

According to one embodiment of the present disclosure, a method of forming a split gate memory cell includes aligning the control gate of the split gate memory cell to the select gate of the cell using an inlaid chemical mechanical polish (CMP) process flow. Both of the select and control gate lengths are defined lithographically in a same masking step, so as not to be subject to registration errors. Elements of the process include: i) the select gate and the control gate lengths being defined lithographically, wherein one mask defines both gate lengths, ii) sacrificial structures (also referred to herein as dummy gate features) are formed during formation of the select and control gates in order to allow for drain and source contacts in the bitcell area to also be formed, and iii) a masking scheme which allows for removal of the sacrificial structures without requiring a line-on-line overlay of masks. Accordingly, the embodiments of the present disclosure resolve the problem of forming a split-gate nanocrystal memory device by patterning a select gate lithographically and controlling a gate length of a corresponding control gate in a self-aligned manner. In addition, semiconductor fabrication techniques, including, for example, layer deposition, photoresist masking, deposit and etch back, chemical mechanical planarization, etc. are generally well known, and thus only briefly discussed herein.

According to another embodiment of the present disclosure, a single masking step is used to etch the select gate which has a thick nitride anti-refelective coating (ARC) and a 1000-1200 angstrom polysilicon layer. After patterning of the select gate, the non-volatile memory (NVM) stack is formed and the excess poly silicon is removed by a planarization step, such as polish or blanket etch back. In one embodiment, the NVM stack includes a stack of tunnel oxide, nanocrystals, control oxide, and a polysilicon control gate. A sequence of processing steps follows which include oxidation of the exposed polysilicon and the deposition of an oxide to form an etch stop layer. Two subsequent masking steps are then used to remove sacrificial select and control gate features that are formed as a consequence of building the device. The subsequent masking steps overlay the existing gate structures so that line-on-line alignment of the subsequent masking layers is not required.

Figure 1:
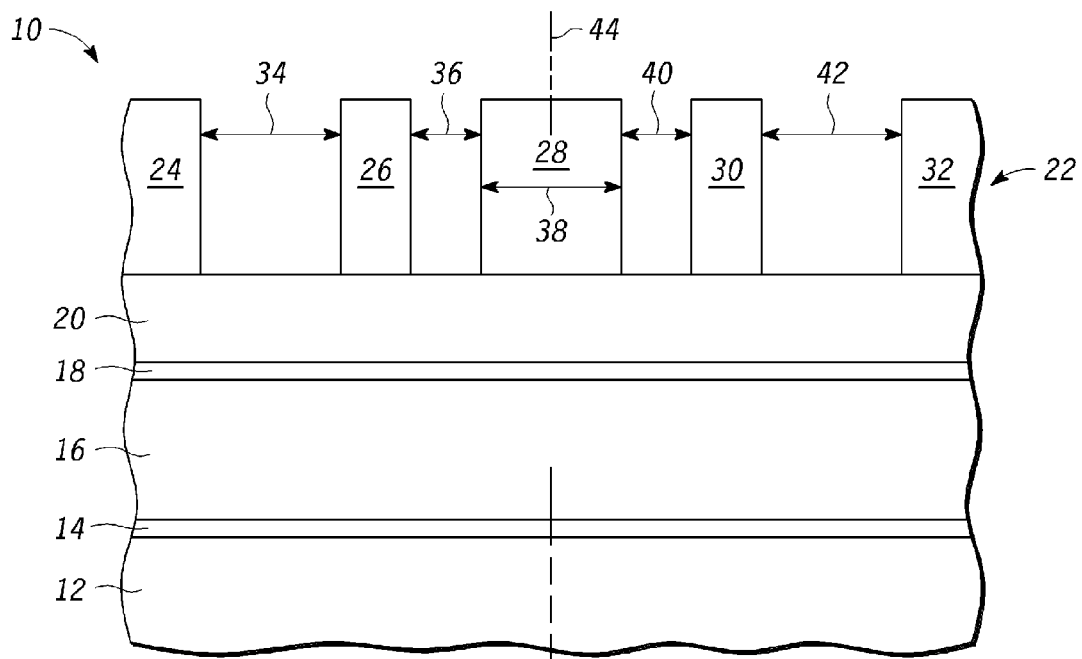
FIG. 1 is a cross-sectional view of a patterned photoresist disposed on a top surface of a stack of layers overlying a substrate in the manufacture of a self-aligned split gate memory cell according to the embodiments of the present disclosure.

FIG. 1 is a cross-sectional view of a patterned photoresist disposed on a top surface of a stack of layers overlying a substrate in the manufacture of a self-aligned split gate memory cell according to the embodiments of the present disclosure. The method making a self-aligned split gate memory cell structure 10 begins with a stack of layers overlying a starting substrate 12. In one embodiment, substrate 12 comprises a silicon substrate. However, substrate 12 can comprise any suitable substrate selected according to the requirements of a given memory cell design. In addition, in one embodiment, the stack of layers overlying substrate 12 includes an oxide layer 14, a polysilicon layer 16, another oxide layer 18, and a nitride layer 20. The oxide layer 14 comprises a grown oxide and/or a deposited oxide, having characteristics according to the requirements of a select gate oxide of the select gate yet to be formed. Polysilicon layer 16 comprises a deposited polysilicon layer, having characteristics according to the requirements of the select gate yet to be formed. For example, polysilicon layer 16 is deposited to a thickness on the order of 1000 to 1200 angstroms. In addition, polysilicon layer 16 can be predoped, via implanting with phosphorous or arsenic in appropriate regions. Oxide 18 comprises a pad oxide, wherein the pad oxide is grown or deposited over the polysilicon layer 16. Nitride layer 20 comprises, for example, a deposited nitride of stochiometric or SiRN nitride, having a thickness on the order of 500 to 2000 angstroms.

Referring still to FIG. 1, a patterned photoresist 22 is formed overlying the nitride layer 20. Patterned photoresist 22 is used to define a select gate pattern in the non-volatile memory regions. For example, patterned photoresist 22 includes portions 24, 26, 28, 30 and 32. Portions 24, 26, 30 and 32 represent select gate pattern portions, whereas portion 28 represents a first sacrificial feature pattern portion. Select gate pattern portion 24 is spaced from select gate pattern portion 26 by a distance represented by the arrow 34. The distance 34 is used to define a region within the underlying stack, to be subsequently used in the formation of a bit line contact (yet to be formed).

Prior to formation of the bit line contact, however, a second sacrificial feature is to be formed having a width dimension on the order of distance 34. The width of the second sacrificial feature is selected for providing approximate select gate spacing, as will be understood further herein. In other words, the distance 34 is used to define a region within the underlying stack, which will be subsequently used in the formation of a second sacrificial feature or dummy gate (yet to be formed). The second sacrificial feature or dummy gate is used to define the spacing between two select gates of two adjacent split gate memory devices, (yet to be formed), and wherein the region between the two split gates, subsequent to removal of the second sacrificial feature, is further for use in the formation of the corresponding split gate contact, referred to above as the bit line contact (yet to be formed).

Select gate pattern portion 26 is spaced from sacrificial feature pattern portion 28 by a distance represented by the arrow 36. The distance 36 is used to define a region within the underlying stack, to be subsequently used in the formation of a control gate (yet to be formed).

Sacrificial feature pattern portion 28 includes a width dimension as indicated by reference numeral 38. The width of sacrificial feature pattern portion 28 is selected for providing an approximate control gate spacing, as will be understood further herein. In other words, the distance 38 is used to define a region within the underlying stack, which will be subsequently used as a sacrificial feature or dummy gate (yet to be formed). The sacrificial feature or dummy gate is used to define the spacing between two control gates of two adjacent split gate memory devices, (yet to be formed), and wherein the region between the two control gates is further for use in the formation of a source contact (yet to be formed).

Sacrificial feature pattern portion 28 is also spaced from select gate feature pattern portion 30 by a distance represented by the arrow 40. The distance 40 is used to define a region within the underlying stack, to be subsequently used in the formation of another control gate (yet to be formed).

Select gate pattern portion 30 is spaced from select gate pattern portion 32 by a distance represented by the arrow 42. The distance 42 is used to define another region within the underlying stack, to be subsequently used in the formation of a second bit line contact (yet to be formed).

Prior to formation of the second bit line contact, however, a third sacrificial feature is to be formed having a width dimension on the order of distance 42. The width of the third sacrificial feature is selected for providing approximate select gate spacing, as will be understood further herein. In other words, the distance 42 is used to define a region within the underlying stack, which will be subsequently used in the formation of the third sacrificial feature or dummy gate (yet to be formed). The third sacrificial feature or dummy gate is used to define the spacing between two select gates of two adjacent split gate memory devices, (yet to be formed), and wherein the region between the two split gates, subsequent to removal of the second sacrificial feature, is further for use in the formation of a corresponding split gate contact, referred to above as the second bit line contact (yet to be formed).

In FIG. 1, a line indicated by reference numeral 44 represents a line of symmetry, about which two split gate memory devices can be formed according to the embodiments of the present disclosure.

An etch, with use of a suitable etch chemistry, is performed for etching the nitride layer 20, oxide layer 18, polysilicon layer 16 and oxide layer 14 according to the patterned photoresist 22. As a result, spacings 34, 36, 40 and 42 are transferred into the stack of layers 20, 18, 16 and 14. Etching appropriately stops on the substrate 12. Subsequent to the etching step, the patterned photoresist 22 is removed using any suitable removal technique.

Figure 2:
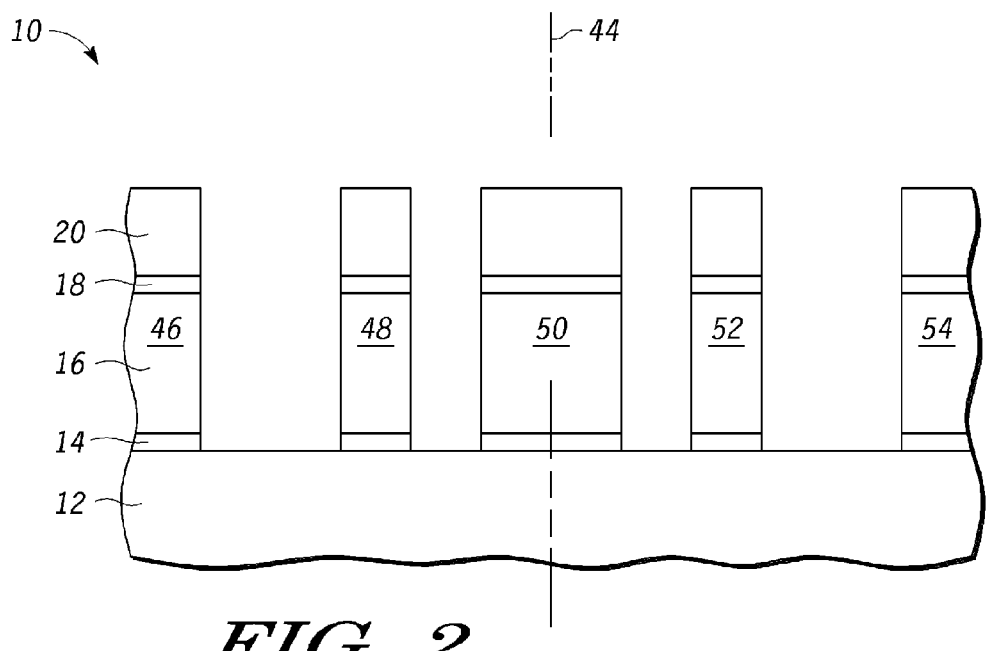
FIG. 2 a cross-sectional view of the self-aligned split gate memory cell of FIG. 1 at a subsequent point in the manufacture thereof, FIGS. 3-13 include cross-sectional views of the self-aligned split gate memory cell during various steps in the manufacture thereof according to one embodiment of the present disclosure.

FIG. 2 a cross-sectional view of the self-aligned split gate memory cell of FIG. 1 at a subsequent point in the manufacture thereof. In particular, the cross-sectional view of FIG. 2 is representative of the layer structure subsequent of the etch pattern transfer of the patterned photoresist 22 into the stack of layers. Portions of polysilicon layer 16 remaining subsequent to the etch step include portions 46, 48, 50, 52 and 54. In addition, portions 46, 48, 52 and 54 will be used as select gate polysilicon in the subsequently formed split gate memory devices. Furthermore, portion 50, as well as the immediately overlying remaining portions of oxide 18 and nitride 20, and the underlying portion of oxide 14, all together form a first sacrificial feature (also referred to as a sacrificial structure or dummy gate), as will be discussed and understood further herein. In one embodiment, a counterdoping species is implanted within exposed regions of substrate 12 of the structure of FIG. 2 according to the requirements of a given split gate memory cell design. The counterdoping can be implemented using any suitable techniques.

Figure 3:
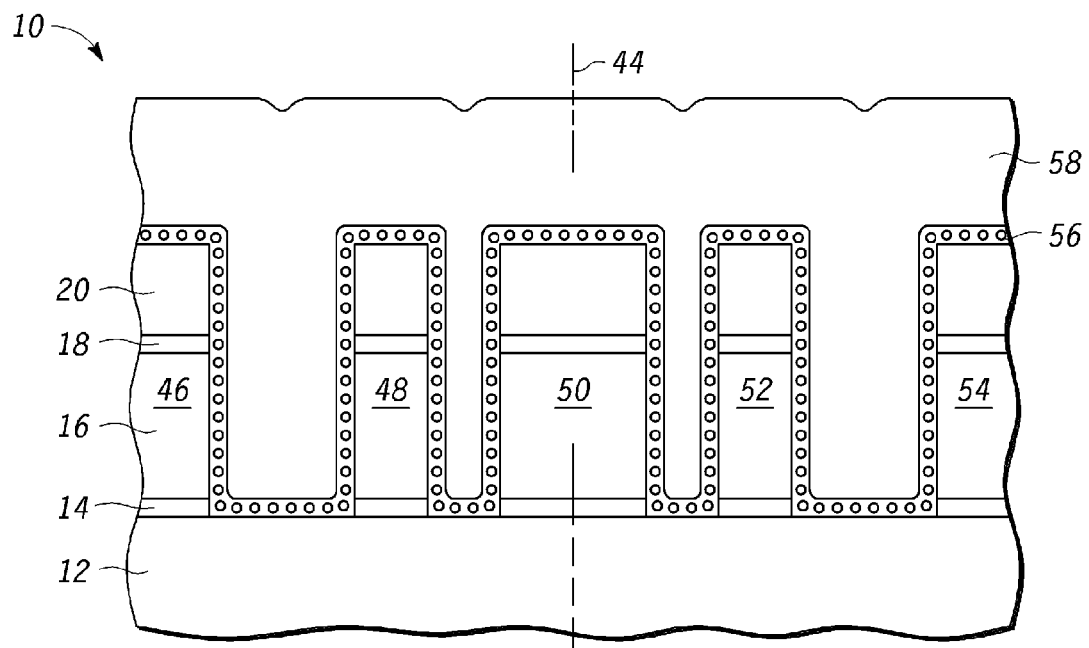

Turning now to the further figures, it is noted that FIGS. 3-13 include cross-sectional views of the self-aligned split gate memory cell during various steps in the manufacture thereof according to one embodiment of the present disclosure. In FIG. 3, a storage or memory layer 56 (or stack of layers) is (are) formed overlying the patterned structure of FIG. 2, on exposed top surfaces and sidewalls. In one embodiment, the storage layer 56 comprises a stack of layers, wherein the stack of layers includes a non-volatile memory tunnel oxide layer, a layer of nanocrystals, and a top control oxide layer (all together illustrated as a single layer). In addition, the non-volatile memory tunnel oxide layer is grown using suitable techniques. The layer of nanocrystals is deposited using suitable techniques. Furthermore, the top control oxide layer can comprise a deposited oxide or a grown oxide, wherein the deposited oxide layer is formed using suitable oxide deposition techniques and the grown oxide layer is formed using suitable oxide growth techniques.

Subsequent to the formation of the storage layer 56, a second layer of polysilicon 58 is deposited overlying storage layer 56, on top surfaces and sidewalls, using any suitable deposition technique(s). In one embodiment, the second layer of polysilicon 58 comprises a blanket deposition of polysilicon, wherein the blanket deposition is sufficient to at least substantially fill the otherwise unfilled regions situated between adjacent regions of the storage layer 56 overlying the stacks of oxide 14, polysilicon 16, oxide 18 and nitride 20. In one embodiment, the blanket deposition of the second layer of polysilicon 58 fills openings and substantially covers the entire structure, as shown in FIG. 3. In another embodiment, the second layer of polysilicon 58 is doped, with either N-type or P-type doping, according to the requirements of a given split gate memory device implementation. Furthermore, the second layer of polysilicon 58 is deposited to a thickness on the order of approximately 1500-5000 angstroms.

Figure 4:
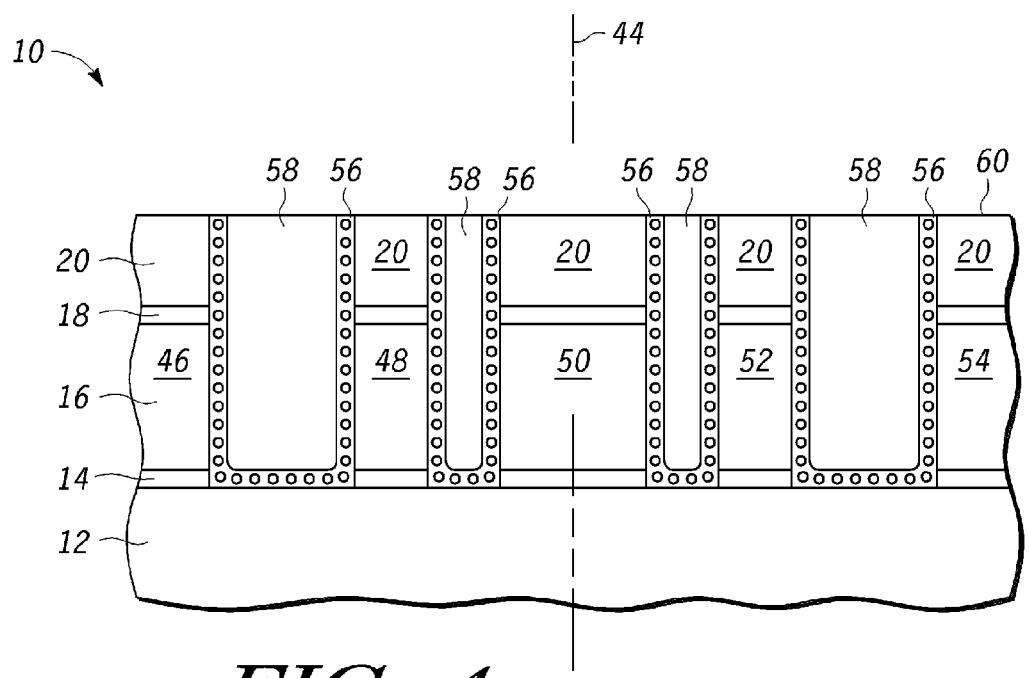

Subsequent to the deposition of the second polysilicon layer 58, the structure of FIG. 3 is planarized using a suitable planarization technique(s), for example, a suitable chemical mechanical polish technique or etch back planarization technique. The planarization is preferably stopped on the nitride layer 20. As shown in FIG. 4, the planarized structure includes a substantially planarized top surface, as indicated by reference numeral 60. As shown in FIG. 4, the top surface 60 coincides with the original top surface of nitride layer 20, or alternatively, it may be slightly below the original top surface of nitride layer 20.

Figure 5:
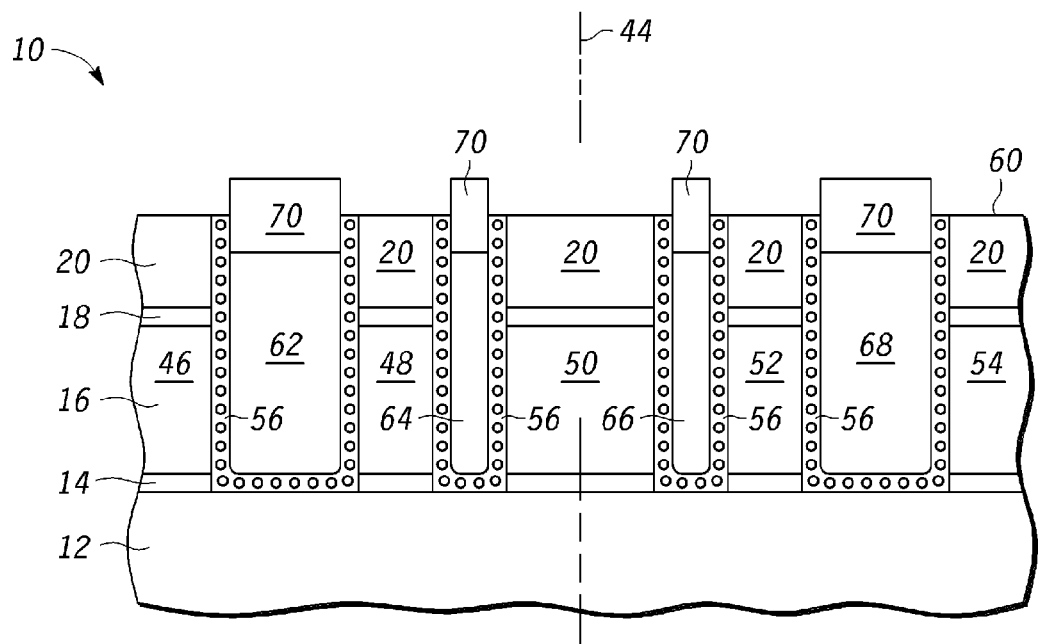

Referring now to FIG. 5, subsequent to the planarization step associated with FIG. 4, an oxidation process is used to form a layer of oxide on top of the second layer of polysilicon. In particular, a poly oxide, indicated by reference numeral 70, is formed on exposed portions of the second polysilicon layer, indicated by reference numerals 62, 64, 66 and 68. In one embodiment, poly oxide 70 is formed by a suitable oxide growth technique, having a thickness on the order of approximately 100-400 angstroms. Since nitride does not grow oxide readily, substantially no oxide is formed on the nitride layer 20. Furthermore, as will be understood further herein, the polysilicon regions 64 and 66 will become the control gates of two adjacent split gate memory cells (yet to be formed). In addition, the polysilicon regions 62 and 68, and their respective immediately adjacent oxide 70 and storage layer 56, will serve as second and third sacrificial features (also referred to as sacrificial structures or dummy gates), respectively as mentioned herein above, and to be discussed further herein below.

Figure 6:
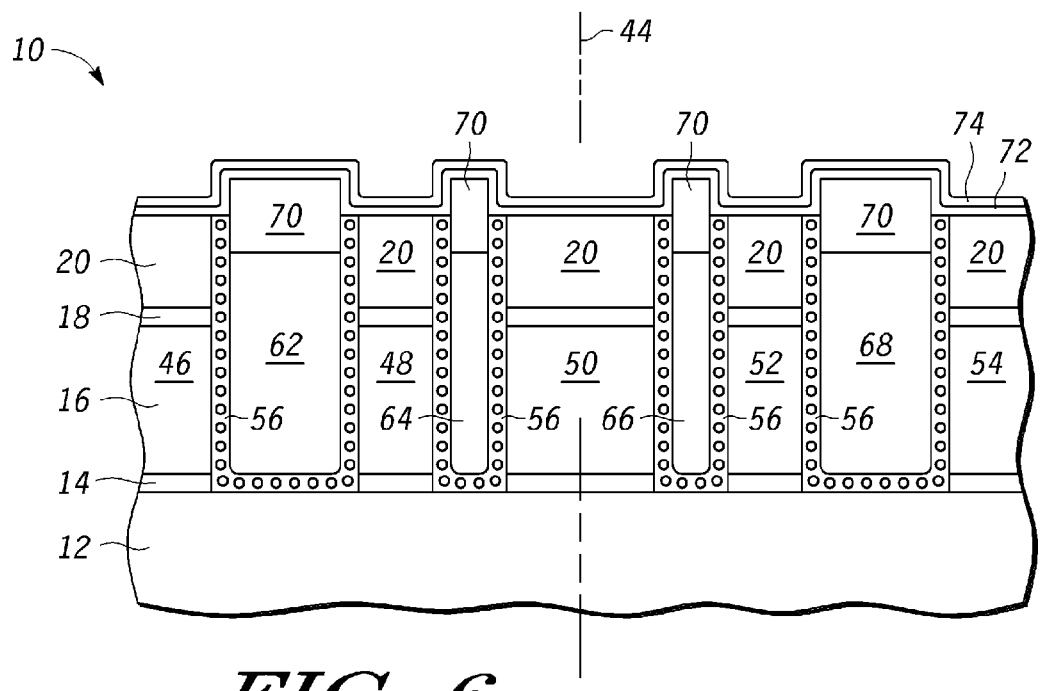

Referring now to FIG. 6, a layer of nitride 72 is deposited overlying the structure of FIG. 5, followed by deposition of a layer 74 of TEOS or other suitable oxide. Nitride layer 72 is deposited to a thickness of approximately 250 angstroms. Similarly, layer 74 is deposited to a thickness of approximately 250 angstroms.

Figure 7:
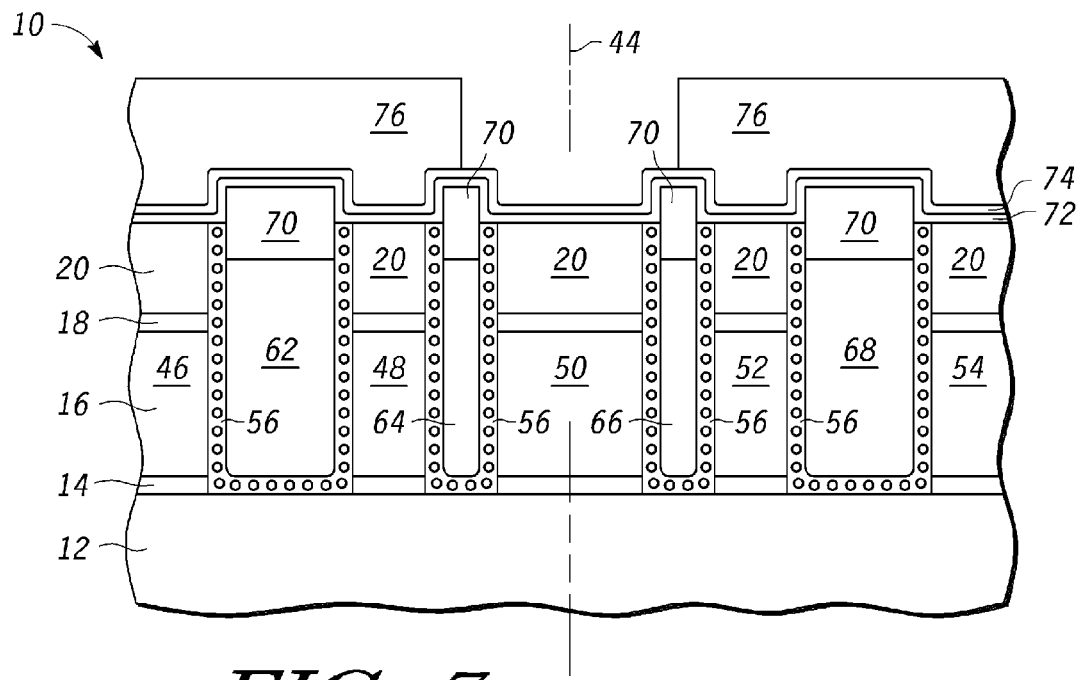
Figure 8:
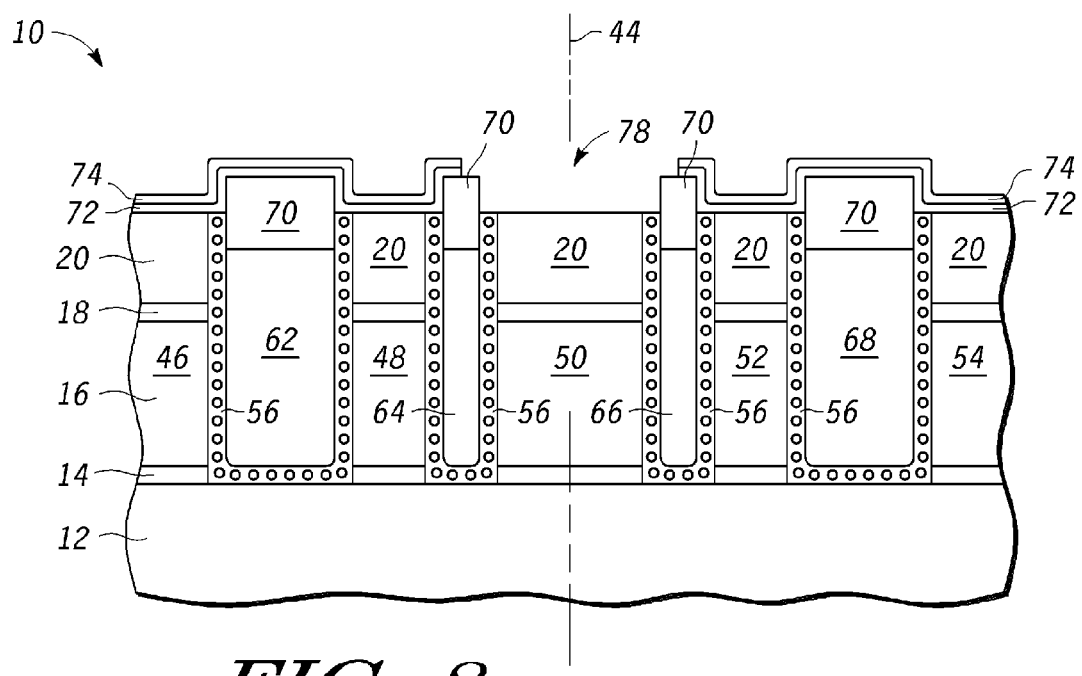

In FIG. 7, a second masking step is performed to cover the select gate polysilicon regions, such as indicated by reference numerals 46, 48, 52 and 54, as well as cover a portion of corresponding adjacent control gate polysilicon regions, such as indicated by reference numerals 64 and 66 (note that adjacent control gate polysilicon (not shown) for select gate polysilicon regions 46 and 54 would be to the left and to the right, respectively, of the illustration of FIG. 7). In particular, a patterned photoresist 76 includes a pattern opening that overlies the first sacrificial feature, wherein the first sacrificial feature includes the polysilicon region 50, as well as the immediately overlying remaining portions of oxide 18 and nitride 20, and the underlying portion of oxide 14. A suitable etch is then used to remove the TEOS layer 74 and nitride layer 72 in the region defined by the pattern opening in photoresist 76, thus forming an opening 78 in layers 74 and 72 as shown in FIG. 8. In addition, note that since oxide 70 comprises a grown thermal oxide covering the underlying polysilicon, oxide 70 substantially remains after the wet etch due to its slower etch rate compared to that of a deposited oxide. Furthermore, formation of opening 78 is in preparation for removal of the first sacrificial structure. Still further, subsequent to the wet etching step, the patterned photoresist 76 is removed using any suitable removal technique, for example, a piranha clean or a plasma ash strip.

Figure 9:
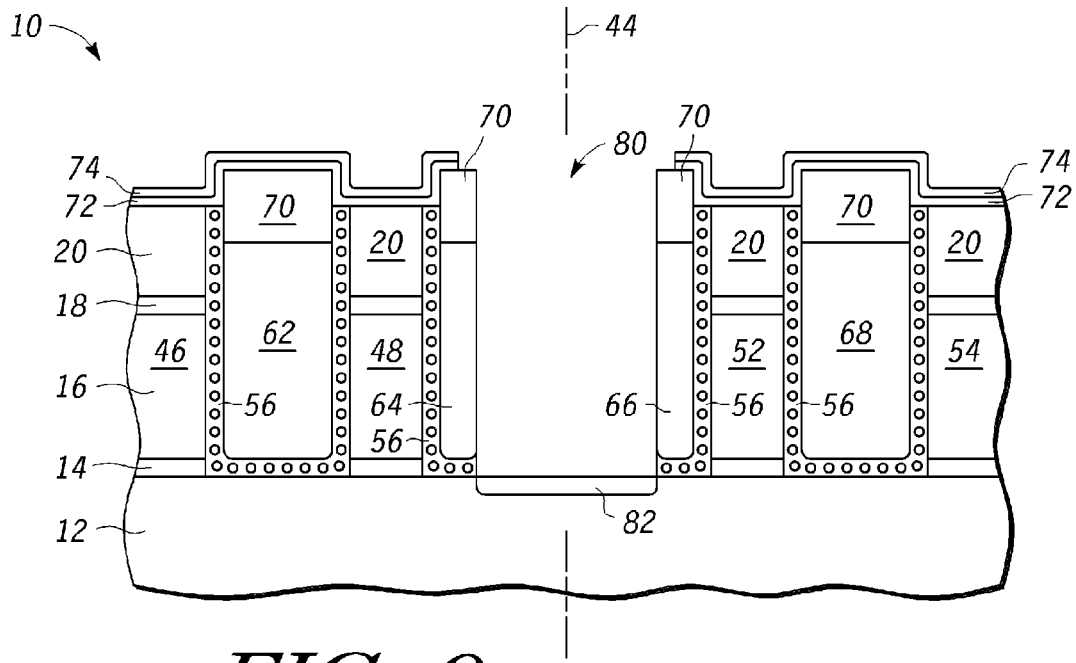

Subsequent to formation of opening 78 and removal of patterned photoresist 76, another etch is used for removal of the then exposed first sacrificial structure, to obtain an opening 80 in the structure as illustrated in FIG. 9. The remaining portion of TEOS layer 74 and exposed oxide 70 functions as a mask during the etching of opening 80. In particular, polysilicon region 50, as well as the immediately overlying remaining portions of oxide 18 and nitride 20, and the underlying portion of oxide 14, and portions of storage layer 56 along adjoining sidewalls, are removed to form opening 80. Removal of the first sacrificial structure includes, for example, a hot phosphoric etch to remove the nitride 20 followed by subsequent suitable etches to remove layers 18, 16, 14, as well as appropriate portions of storage layer 56. In one embodiment, a counter doping species is implanted within exposed regions of substrate 12 of the structure of FIG. 9 to form implant region 82, for a given source/drain implant, according to the requirements of a given split gate memory cell design. The counter doping can be implemented using any suitable techniques.

Figure 10:
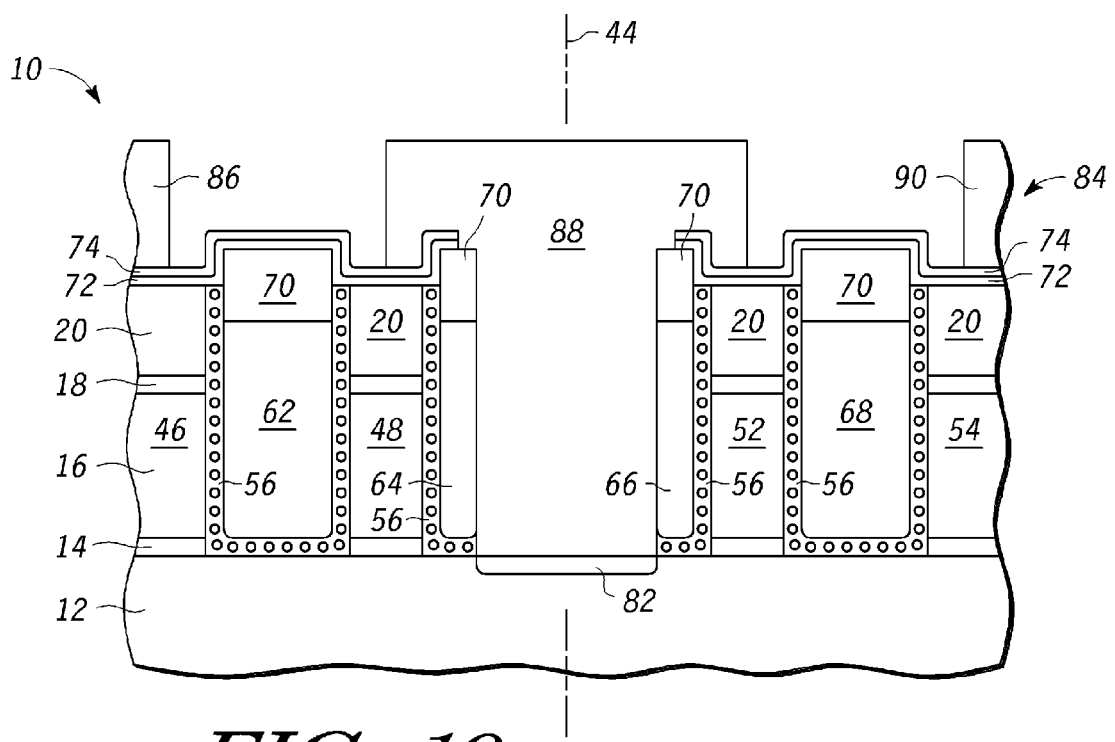

In FIG. 10, a second masking step is performed to cover the control gate polysilicon regions, such as indicated by reference numerals 64 and 66, as well as cover a portion of corresponding adjacent select gate polysilicon regions, such as indicated by reference numerals 48 and 52 (note that control gate polysilicon regions (not shown) for corresponding adjacent select gate polysilicon 46 and 54 would be to the left and to the right, respectively, of the illustration of FIG. 10). In particular, a patterned photoresist 84 includes a pattern opening that overlies the second and third sacrificial features. Photo resist mask 84 includes portions 86, 88 and 90. Portion 88 provides a control gate mask feature for control gates 64 and 66, immediately to the left and to the right of the symmetry line 44, further covering a portion of a corresponding select gate (48,52). Portions 86 and 88 provide control gate masks for control gate polysilicon regions (not shown) for corresponding adjacent select gate polysilicon 46 and 54 that would be to the left and to the right, respectively, of the illustration of FIG. 10, further covering a portion of a corresponding select gate (46,54).

Figure 11:
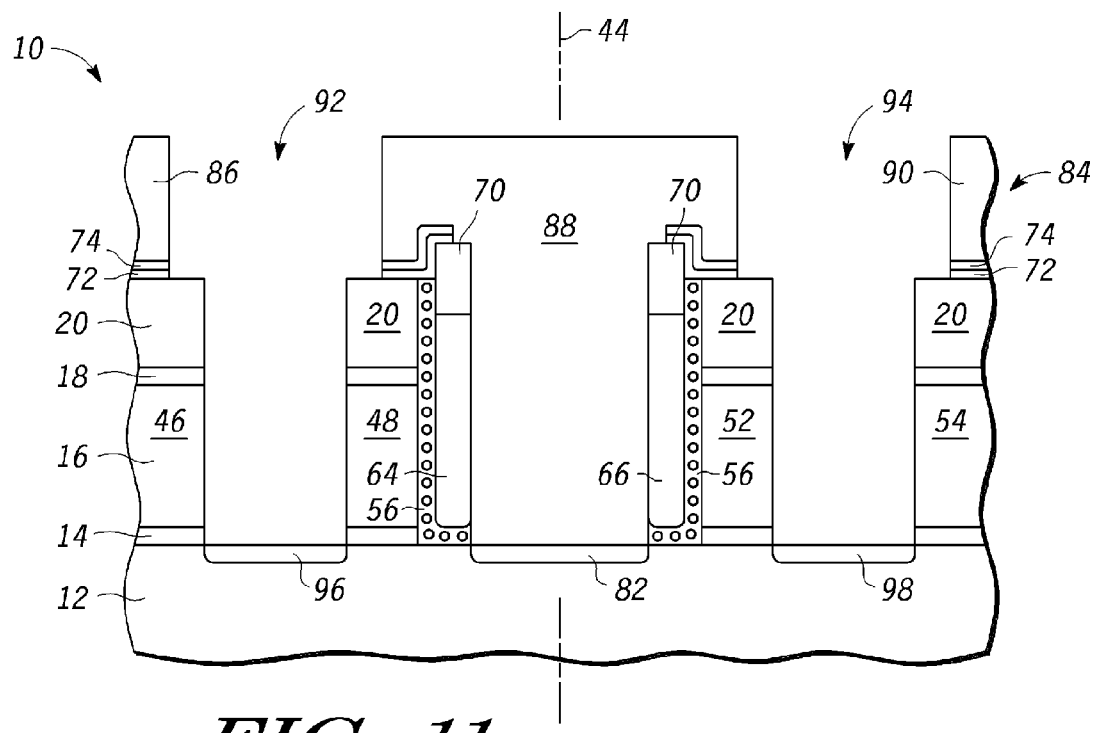

The second and third sacrificial features include the polysilicon regions 62 and 68, and their respective immediately adjacent oxide 70 and storage layer 56 (also referred to as sacrificial structures or dummy gates). A suitable dry etch is then used to remove the TEOS layer 74, nitride layer 72, oxide 70, followed by one or more suitable etches to remove polysilicon 62 and storage layer 56 (along sidewalls and bottom surface adjacent substrate 12) in the regions defined by the pattern openings in photoresist 84, thus forming openings 92 and 94, respectively as shown in FIG. 11. In addition, note that nitride 20, covering the underlying polysilicon 46, 48, 52 and 54, remains after the dry etch. Accordingly, etching provides for removal of the second and third sacrificial structures. In one embodiment, a counter doping species is implanted within exposed regions of substrate 12 of the structure of FIG. 11 to form implant regions 96 and 98, for a given source/drain implant, according to the requirements of a given split gate memory cell design. The counter doping can be implemented using any suitable techniques.

With patterned photoresist 84 still in place, in a subsequent step, the remaining nitride 20 overlying the select gate polysilicon 46, 48, 52 and 54 is removed using a suitable nitride wet etch. Subsequent to the nitride etching step, the patterned photoresist 84 is removed using any suitable removal technique, for example, a piranha clean or a plasma ash strip, wherein opening 100 is formed and the structure of FIG. 12 is obtained.

Figure 12:
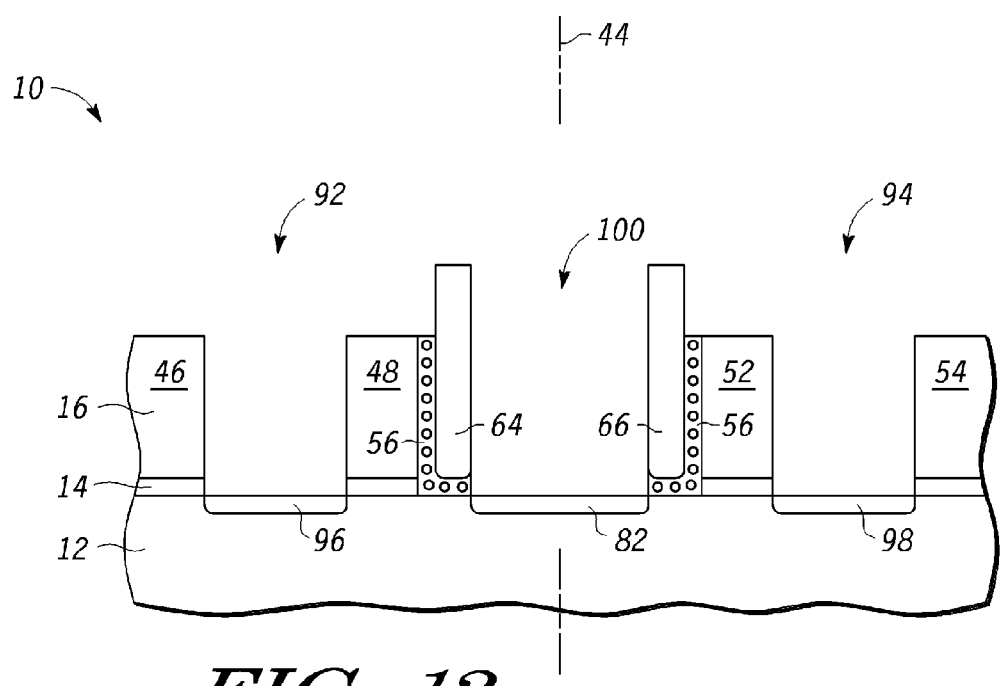
Figure 13:
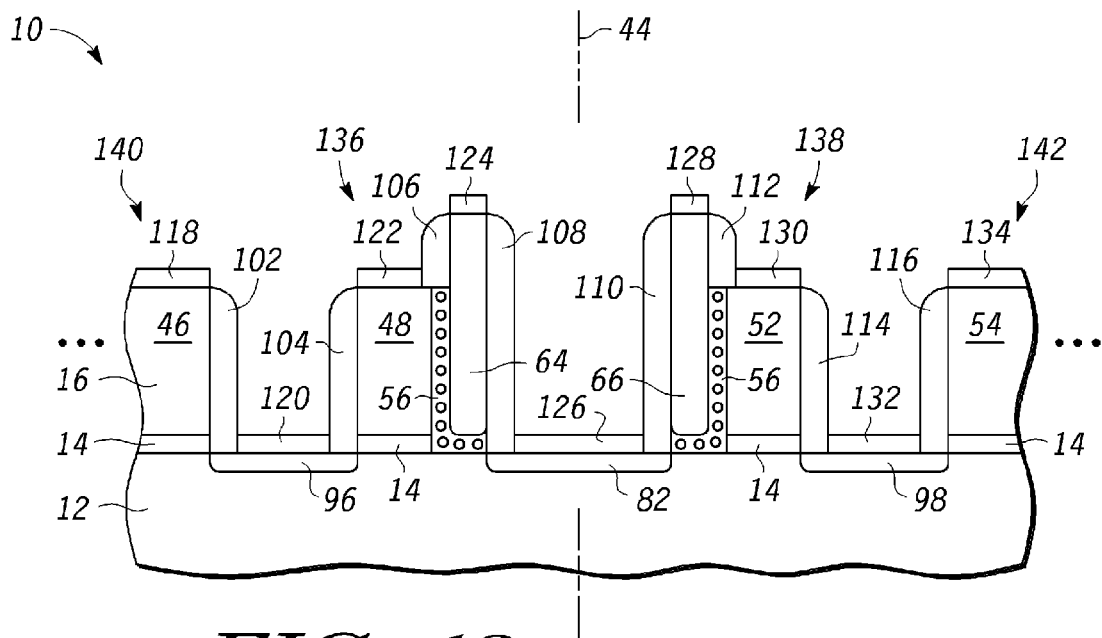

The structure of FIG. 12 is then further processed using suitable steps in a CMOS process flow for completion of split gate memory cell devices. In particular, sidewall spacers 102, 104, 106, 108, 110, 112, 114 and 116 are formed adjacent corresponding select gate and control gate polysilicon. Note that the sidewall spacers formed between the select and control gate are a natural consequence of the height differential between the two gates. Silicide regions 118, 120, 122, 124, 126, 128, 130, 132 and 134 are formed on corresponding select gate, control gate and S/D regions. Illustrated in FIG. 13 are completed memory cell devices 136 and 138, as well as, portions (i.e., select gates 46 and 54, respectively) of memory cell devices 140 and 142.

Turning now to further FIGS. 14-24, the figures include cross-sectional views of the self-aligned split gate memory cell 11 during various steps in the manufacture thereof according to another embodiment of the present disclosure.

The embodiment of FIGS. 14-24 is similar to the embodiment previously discussed, with differences as indicated in the following discussion. Beginning with the structure of FIG. 2, the openings (created by the pattern transfer etch of the patterned photoresist of FIG. 1) are filled with an oxide and polished to produce the structure of FIG. 14. In other words, an oxide is deposited onto the structure of FIG. 2, on top surfaces and sidewalls, filling the openings, using any suitable deposition technique. In one embodiment, the oxide comprises a blanket deposition of oxide, wherein the blanket deposition is sufficient to at least fill the otherwise unfilled regions situated between the stacks of oxide 14, polysilicon 16, oxide 18 and nitride 20. In one embodiment, the blanket deposition of the layer of oxide fills openings and substantially covers the entire structure. Note that the oxide may be deposited by a variety of methods, including, for example, LPCVD, PECVD, spin-on glass, or other suitable technique(s). Furthermore, the oxide layer is deposited to a thickness on the order of approximately 2500-5000 angstroms.

Figure 14:
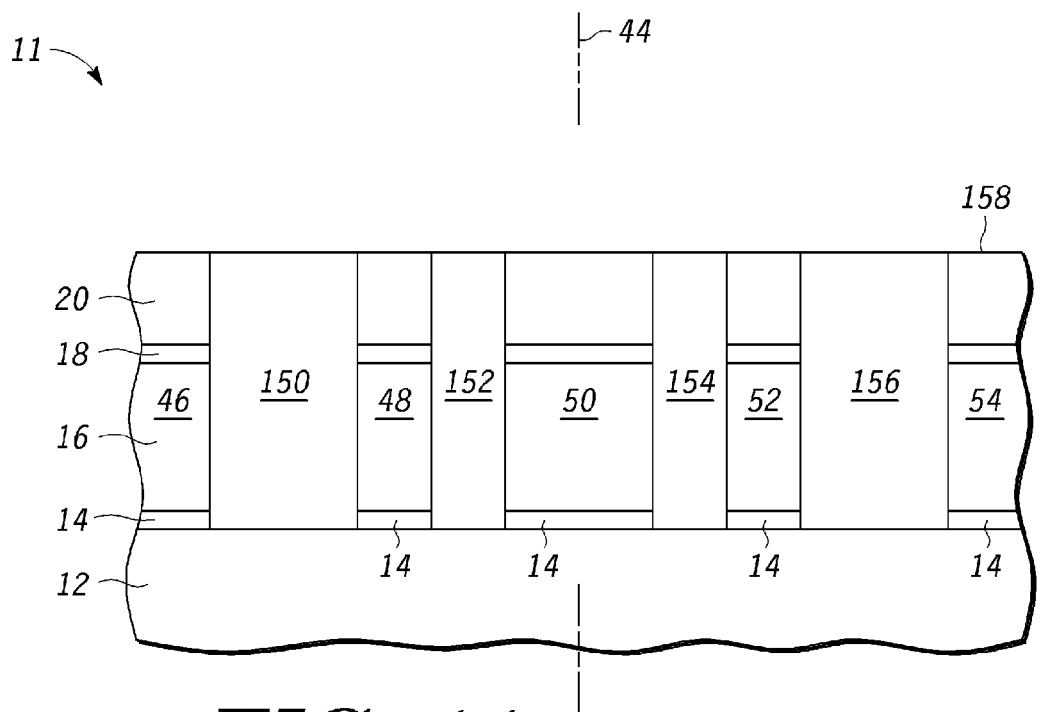
FIGS. 14-24 include cross-sectional views of the self-aligned split gate memory cell during various steps in the manufacture thereof according to another embodiment of the present disclosure.

Subsequent to the deposition of the oxide layer, the structure is planarized using a suitable planarization technique(s), for example, a chemical mechanical polish technique, creating oxide regions 150, 152, 154 and 156. The planarization is preferably stopped on the nitride layer 20. As shown in FIG. 14, the planarized structure includes a substantially planarized top surface, as indicated by reference numeral 158. Furthermore, the top surface 158 coincides with the original top surface of nitride layer 20, or alternatively, it may be slightly below the original top surface of nitride layer 20.

Figure 15:
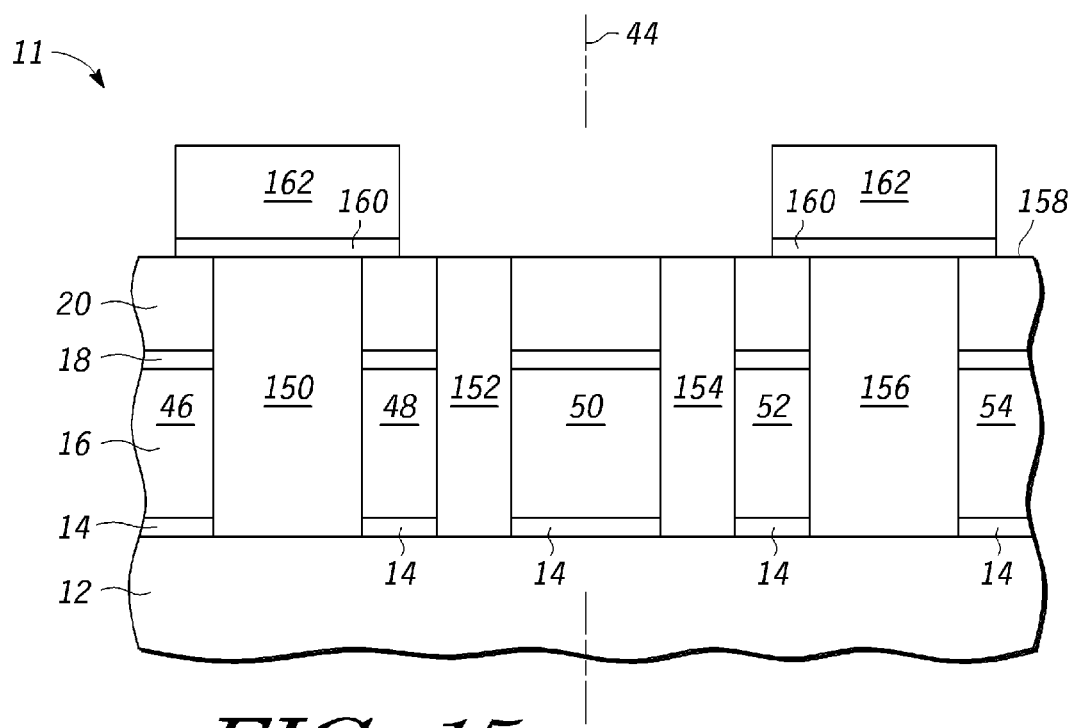

Referring now to FIG. 15, a second masking step is performed to cover at least a portion of the select gate polysilicon regions, such as indicated by reference numerals 46, 48, 52 and 54, as well as cover oxide regions 150 and 156, corresponding to the second and third sacrificial features. Note that oxide regions (not shown) adjacent to select gate polysilicon regions 46 and 54 would be to the left and to the right, respectively, of the illustration of FIG. 15. In this second masking step, a layer of nitride 160 is deposited overlying the structure of FIG. 14, followed by deposition of a photoresist layer 162 and then patterned as appropriate. Nitride layer 160 is deposited to a thickness of approximately 250 angstroms.

Figure 16:
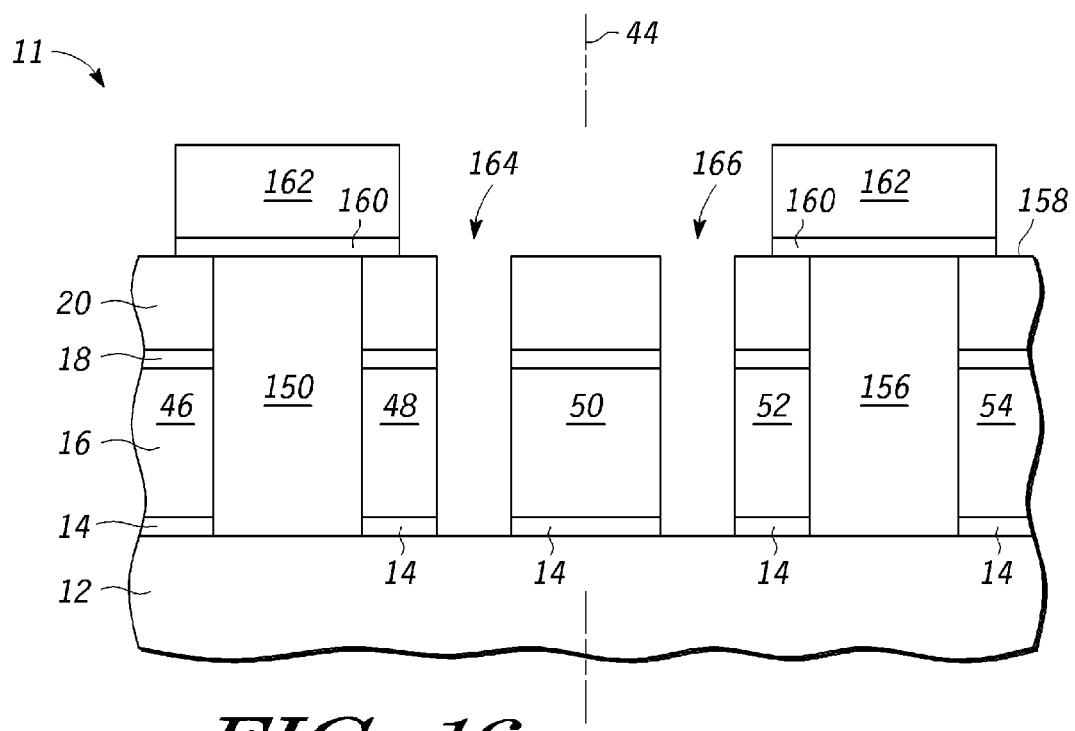

In particular, a patterned photoresist 162 includes a pattern opening that overlies at least the first sacrificial feature, wherein the first sacrificial feature includes the polysilicon region 50, as well as the immediately overlying remaining portions of oxide 18 and nitride 20, and the underlying portion of oxide 14. A wet etch is then used to remove the nitride layer 160 in the region defined by the pattern opening in photoresist 162, thus forming an opening in layer 160 as shown in FIG. 15. Thereafter, another suitable etch is used to remove oxide regions 152 and 154 that comprise deposited oxide, in preparation for the formation of a storage layer and control gate polysilicon, to be discussed further herein. Openings 164 and 166, as shown in FIG. 16, are created upon removal of the oxide regions 152 and 154. Still further, subsequent to the wet etching step, the patterned photoresist 162 (and nitride layer 160) is removed using any suitable removal technique, for example, a piranha clean or a plasma ash strip.

Figure 17:
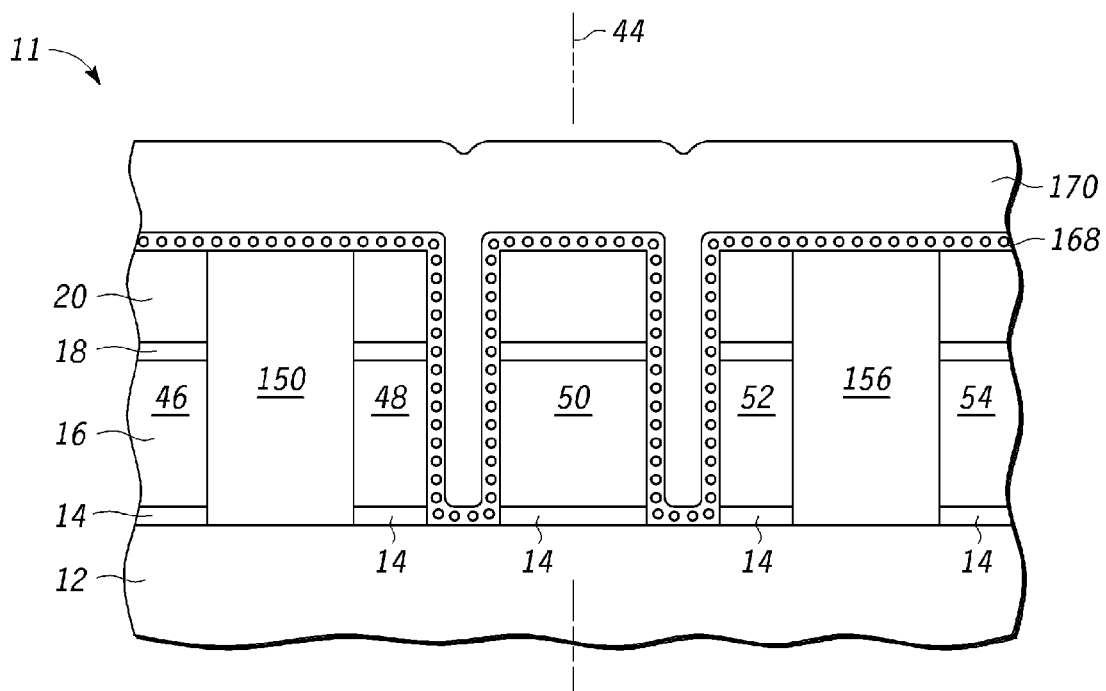

In FIG. 17, a storage or memory layer 168 (or stack of layers) is (are) formed overlying the patterned structure of FIG. 16 (subsequent to removal of photoresist 162 and nitride 160), on exposed top surfaces and sidewalls. In one embodiment, the storage layer 168 comprises a stack of layers, wherein the stack of layers includes a non-volatile memory tunnel oxide layer, a layer of nanocrystals, and a top control oxide layer (all together illustrated as a single layer). In addition, the non-volatile memory tunnel oxide layer is grown using suitable techniques. The layer of nanocrystals is deposited using suitable techniques. Furthermore, the top control oxide layer can comprise a deposited oxide or a grown oxide, wherein the deposited oxide layer is formed using suitable oxide deposition techniques and the grown oxide layer is formed using suitable oxide growth techniques.

Subsequent to the formation of the storage layer 168, a second layer of polysilicon 170 is deposited overlying storage layer 168, on top surfaces and sidewalls, using any suitable deposition technique(s). In one embodiment, the second layer of polysilicon 170 comprises a blanket deposition of polysilicon, wherein the blanket deposition is sufficient to at least substantially fill the otherwise unfilled regions situated between adjacent regions of the storage layer 168 overlying the stacks of oxide 14, polysilicon 16, oxide 18 and nitride 20. In one embodiment, the blanket deposition of the second layer of polysilicon 170 fills openings and substantially covers the entire structure, as shown in FIG. 17. In another embodiment, the second layer of polysilicon 170 is doped, with either N-type or P-type doping, according to the requirements of a given split gate memory device implementation. Furthermore, the second layer of polysilicon 170 is deposited to a thickness on the order of approximately 1500-5000 angstroms.

Figure 18:
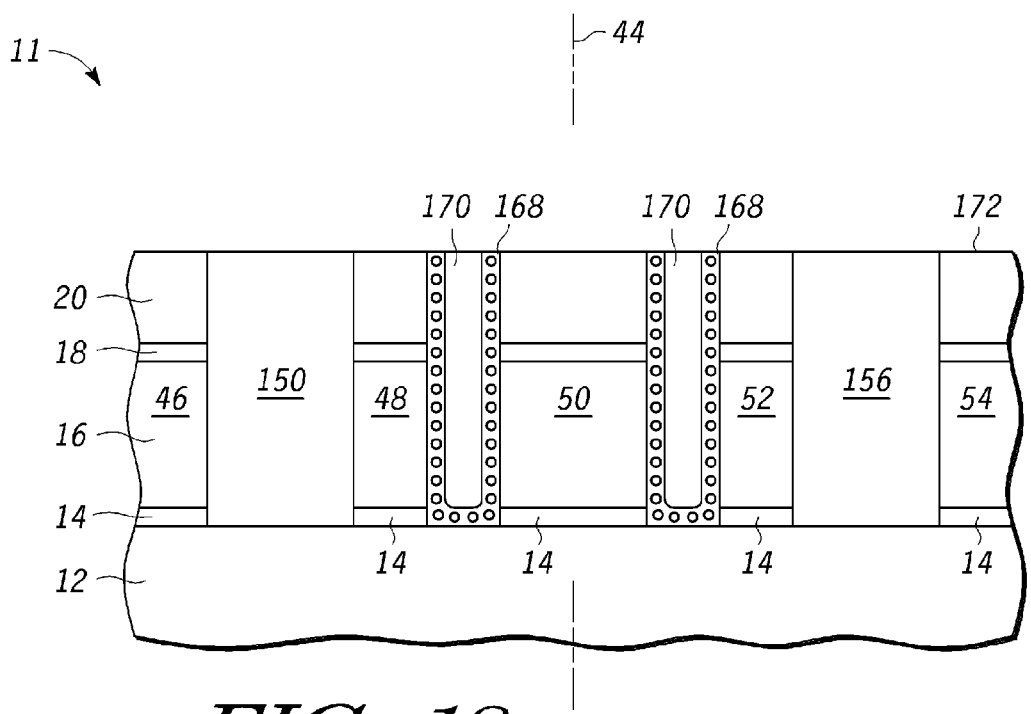

Subsequent to the deposition of the second polysilicon layer 170, the structure of FIG. 17 is planarized using a suitable planarization technique(s), for example, a suitable chemical mechanical polish technique or etch back planarization technique. The planarization is preferably stopped on the nitride layer 20. As shown in FIG. 18, the planarized structure includes a substantially planarized top surface, as indicated by reference numeral 172. As shown in FIG. 18, the top surface 172 coincides with the original top surface of nitride layer 20, or alternatively, it may be slightly below the original top surface of nitride layer 20.

Figure 19:
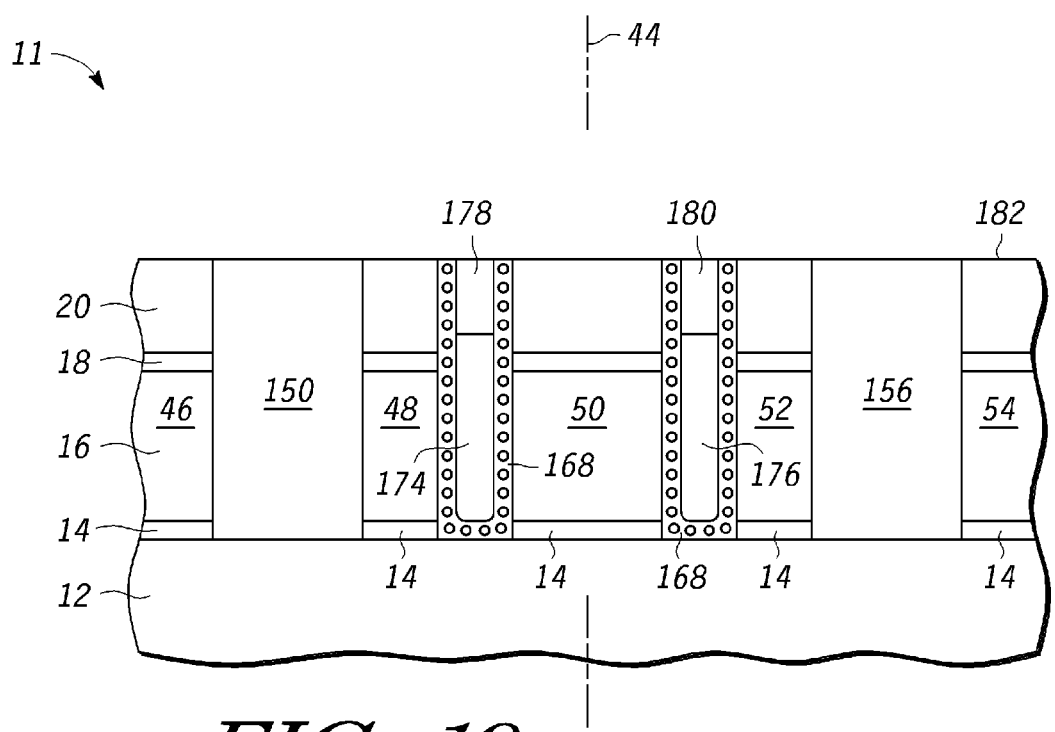

Referring now to FIG. 19, subsequent to the planarization step associated with FIG. 18, a suitable oxidation process is used to form a layer of oxide on top of the second layer of polysilicon. In particular, a poly oxide, indicated by reference numerals 178 and 180, is formed on exposed portions of the second polysilicon layer, indicated by reference numerals 174 and 176. In one embodiment, poly oxide is formed by a suitable oxide growth technique, having a thickness on the order of approximately 100-400 angstroms. Since nitride does not grow oxide readily, substantially no oxide is formed on the nitride layer 20. Furthermore, as will be understood further herein, the polysilicon regions 174 and 176 will become the control gates of two adjacent split gate memory cells (yet to be formed). In addition, the oxide regions 150 and 158, will serve as second and third sacrificial features (also referred to as sacrificial structures), respectively as mentioned herein above, and to be discussed further herein below. In an alternate embodiment, a process of polysilicon etch back, followed by oxide deposition and etch back, could be used in the formation of oxide regions 178 and 180, using suitable techniques.

Figure 20:
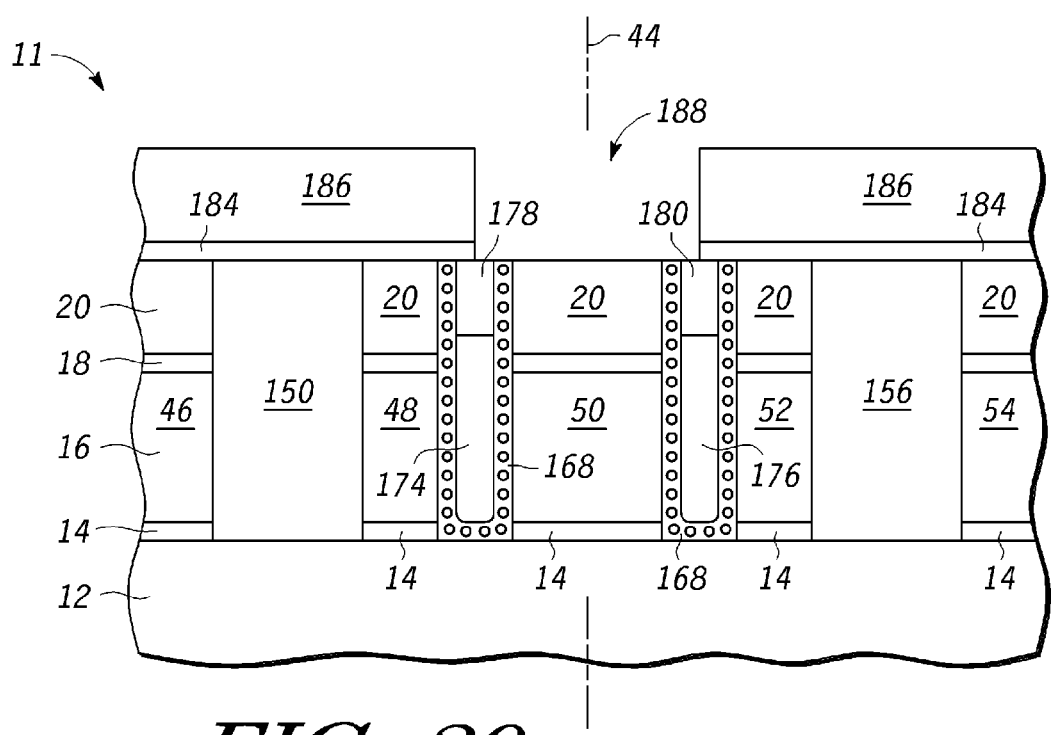

Referring now to FIG. 20, a film of TEOS/nitride 184 (or other suitable film(s)) is deposited overlying the structure of FIG. 19. For example, TEOS/nitride film 184 can comprise a stack of layers similar to layers 74 and 72 discussed previously herein with respect to FIGS. 6 and 7. TEOS/nitride film 184 is deposited to a thickness of approximately 250 angstroms. A third masking step is performed to cover the select gate polysilicon regions, such as indicated by reference numerals 46, 48, 52 and 54, as well as cover a portion of corresponding adjacent control gate polysilicon regions, such as indicated by reference numerals 174 and 176 (note that adjacent control gate polysilicon (not shown) for select gate polysilicon regions 46 and 54 would be to the left and to the right, respectively, of the illustration of FIG. 20). In particular, a patterned photoresist 186 includes a pattern opening that overlies the first sacrificial feature, wherein the first sacrificial feature includes the polysilicon region 50, as well as the immediately overlying remaining portions of oxide 18 and nitride 20, and the underlying portion of oxide 14. A suitable etch is then used to remove the TEOS/nitride film 184 in the region defined by the pattern opening in photoresist 186, thus forming an opening 188 in layer 184 as shown in FIG. 20. In addition, note that since oxide 178 and 180 comprises a grown thermal oxide covering the underlying polysilicon, oxide 178 and 180 substantially remains after the wet etch. In another embodiment, oxide 178 and 180 can comprise an oxide formed via deposit and etch back techniques. Furthermore, formation of opening 188 is in preparation for removal of the first sacrificial structure.

Figure 21:
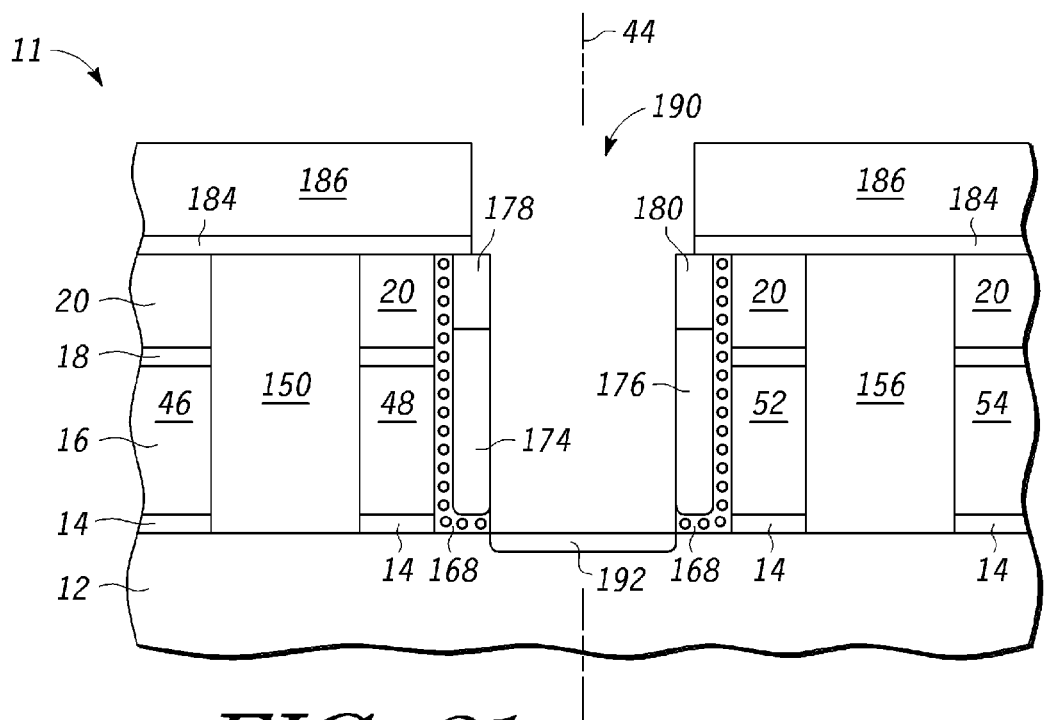

Subsequent to formation of opening 188, another suitable etch is used for removal of the then exposed first sacrificial structure, to obtain an opening 190 in the structure 11 as illustrated in FIG. 21. The patterned photoresist 186, TEOS layer 184 and exposed oxide (178 and 180) function as a mask during the etching of opening 190. In particular, polysilicon region 50, as well as the immediately overlying remaining portions of oxide 18 and nitride 20, and the underlying portion of oxide 14, and portions of storage layer 168 along adjoining sidewalls, are removed to form opening 190. In one embodiment, a counter doping species is implanted within exposed regions of substrate 12 of the structure of FIG. 21 to form implant region 192, for a given source/drain implant, according to the requirements of a given split gate memory cell design. The counter doping can be implemented using any suitable techniques. Still further, subsequent to the wet etching step, the patterned photoresist 186 (and TEOS 184) is removed using any suitable removal technique, for example, a piranha clean or a plasma ash strip.

Figure 22:
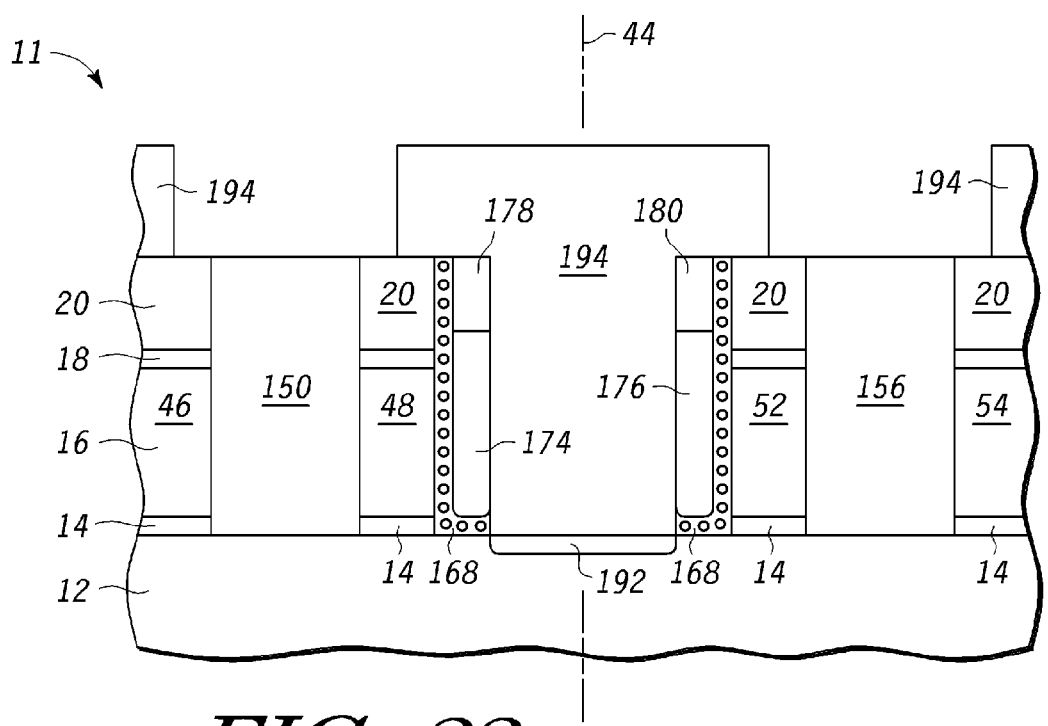

In FIG. 22, a fourth masking step is performed to cover the control gate polysilicon regions, such as indicated by reference numerals 174 and 176, as well as cover a portion of corresponding adjacent select gate polysilicon regions, such as indicated by reference numerals 48 and 52 (note that control gate polysilicon regions (not shown) for corresponding adjacent select gate polysilicon 46 and 54 would be to the left and to the right, respectively, of the illustration of FIG. 22). In particular, a patterned photoresist 194 includes a pattern opening that overlies the second and third sacrificial features. Photo resist mask 194 includes a portion that provides a control gate mask feature for control gates 174 and 176, immediately to the left and to the right of the symmetry line 44, further covering a portion of a corresponding select gate (48,52). Photo resist mask 194 includes further portions that provide control gate masks for control gate polysilicon regions (not shown) for corresponding adjacent select gate polysilicon 46 and 54 that would be to the left and to the right, respectively, of the illustration of FIG. 22, further covering a portion of a corresponding select gate (46,54).

Figure 23:
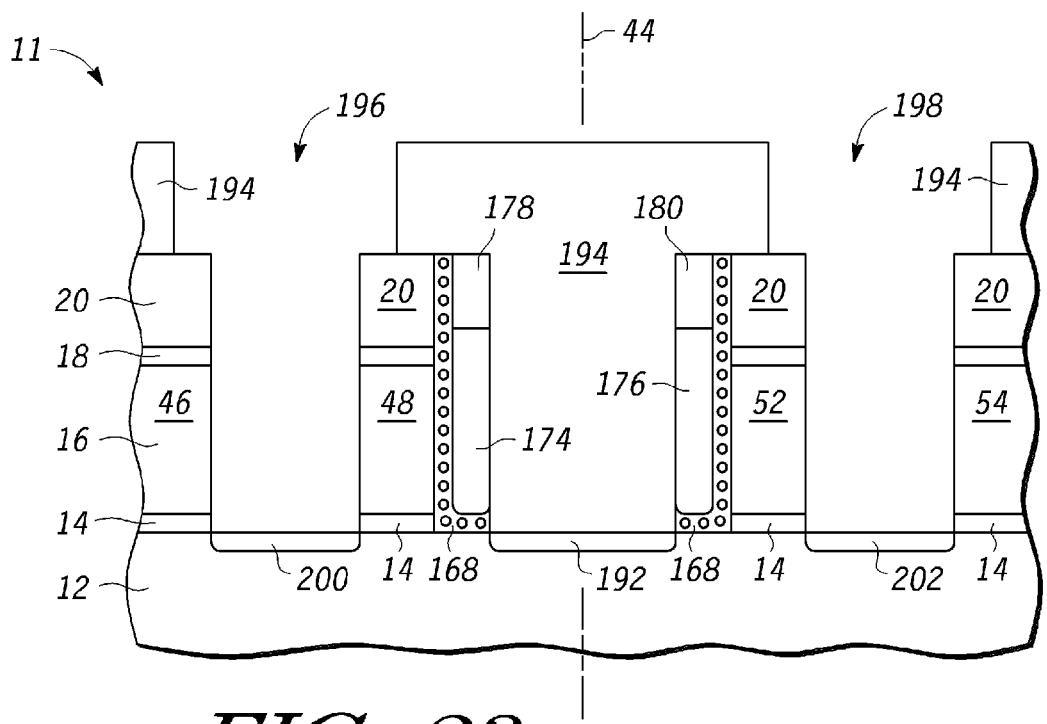

The second and third sacrificial features include the oxide regions 150 and 156 (also referred to as sacrificial structures). A suitable wet etch is then used to remove the oxide regions 150 and 156 (along sidewalls and bottom surface adjacent substrate 12) in the regions defined by the pattern openings in photoresist 194, thus forming openings 196 and 198, respectively as shown in FIG. 23. Accordingly, etching provides for removal of the second and third sacrificial structures. In one embodiment, a counter doping species is implanted within exposed regions of substrate 12 of the structure of FIG. 23 to form implant regions 200 and 202, for a given source/drain implant, according to the requirements of a given split gate memory cell design. The counter doping can be implemented using any suitable techniques. In an alternate embodiment, a patterned nitride spacer overlying storage layer 168 could be used in place of the photoresist mask 194 during removal of the second and third sacrificial structures.

With patterned photoresist 194 still in place, in a subsequent step, the remaining nitride 20 overlying the select gate polysilicon 46, 48, 52 and 54 is removed using a suitable nitride wet etch. Subsequent to the nitride etching step, the patterned photoresist 194 is removed using any suitable removal technique, for example, a piranha clean or a plasma ash strip, wherein an opening is formed in the region of the first sacrificial structure (a structure similar to that as illustrated in FIG. 12 is obtained).

Figure 24:
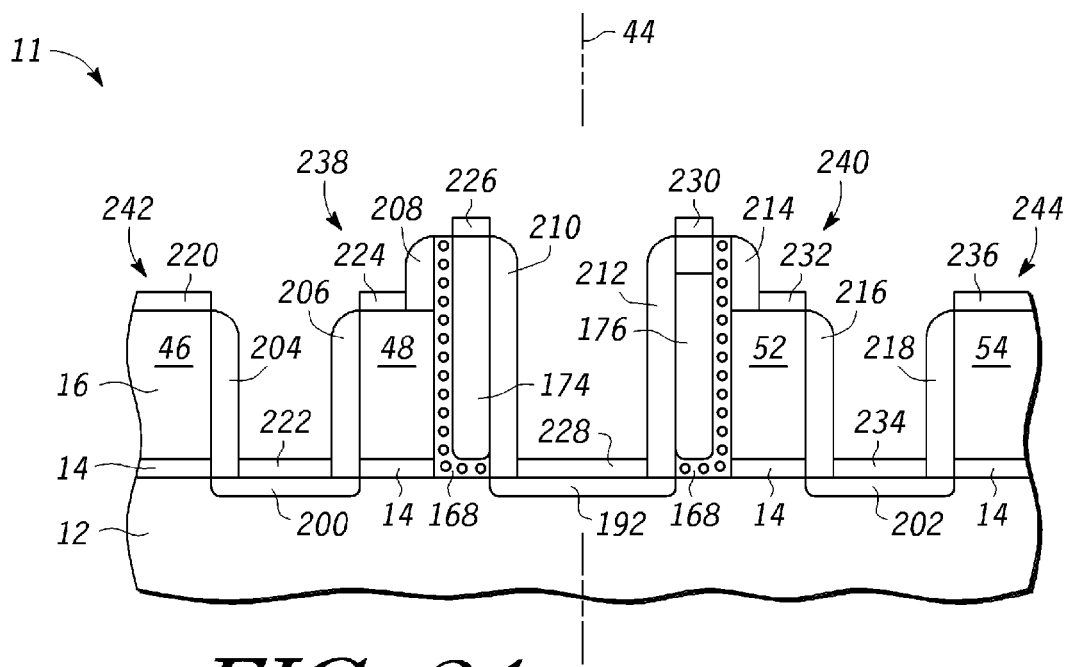

The structure is then further processed using suitable steps in a CMOS process flow for completion of split gate memory cell devices, as shown in FIG. 24. In particular, sidewall spacers 204, 206, 208, 210, 212, 214, 216 and 218 are formed adjacent corresponding select gate and control gate polysilicon. Silicide regions 220, 222, 224, 226, 228, 230, 232, 234 and 236 are formed on corresponding select gate, control gate and S/D regions. Illustrated in FIG. 24 are completed memory cell devices 238 and 240, as well as, portions (i.e., select gates 46 and 54, respectively) of memory cell devices 242 and 244.

Accordingly, the embodiments disclosed herein relate to a method for forming a split gate memory cell using a semiconductor substrate, comprising: forming a select gate structure and a sacrificial structure over the substrate, wherein an opening is between the select gate structure and the sacrificial structure; lining the opening with a storage layer; and filling the opening with control gate material; and removing the sacrificial structure.

n one embodiment, the step of removing the sacrificial structure removes the sacrificial structure from over a source area in the substrate, wherein the method further comprising: implanting into the source area to form a source region in the substrate. The method further comprises providing a sidewall spacer around the source area prior to the step of implanting into the source area. In addition, the step of filling the opening comprises: depositing a layer of polysilicon; and chemical mechanical polishing the polysilicon layer. The method further comprises siliciding a top surface of the select gate and a top surface of the control gate.

In another embodiment, the step of forming a select gate structure and a sacrificial structure over the substrate further comprises forming a sacrificial drain structure over a drain area of the substrate adjacent to the select gate structure. The method further comprises removing the sacrificial drain structure. Still further, the method includes implanting into the drain area to form a drain region. In addition, the step of removing the sacrificial structure removes the sacrificial structure from over a source area in the substrate, and the method further comprises: implanting into the source area to form a source region in the substrate at a different time than the step of implanting into the drain region.

Various additional embodiments include wherein the step of forming is further characterized as forming the sacrificial drain structure after the step of lining the opening. Still further, the step of forming is further characterized as forming the sacrificial drain structure before the step of lining the opening. In one embodiment, the step of lining is further characterized by the storage layer comprising nanocrystals.

According to another embodiment, a method of forming a memory cell having a control gate, a select gate, a source, and a drain, comprises: providing a semiconductor substrate;

forming the select gate and a first sacrificial structure over the substrate, wherein an opening is between the select gate structure and the sacrificial structure; lining the opening with a storage layer; and forming the control gate in the opening after the step of lining; removing the sacrificial structure; forming the source in the substrate adjacent to the control gate; and forming the drain in the substrate adjacent to the select gate. In one embodiment of the method, the step of forming the source comprises performing a first implant; the step of forming the drain comprises performing a second implant at a different time than the first implant; the step of lining the opening is further characterized as lining the opening with nanocrystals. The method further comprises forming a second sacrificial structure over a drain area of the substrate adjacent to the select gate; and removing the second sacrificial structure prior to the step of forming the drain. In another embodiment, the method further comprises: siliciding a top surface of the source, a top surface of the drain, a top surface of the select gate, and a top surface of the control gate.

According to another embodiment, a split gate memory cell comprises a charge storage structure overlying a substrate; a control gate overlying the charge storage structure, wherein the control gate has a silicided top surface; and a select gate overlying the substrate and adjacent to the control gate, wherein the select gate has a silicided top surface. The split gate memory cell further comprises: a drain in the substrate adjacent to the select gate, wherein the drain has a silicided top surface; and a source in the substrate adjacent to the control gate, wherein the source has a silicided top surface. In one embodiment, the charge storage structure extends to an area between the control gate and the select gate. In addition, in the split gate memory cell according to one embodiment of the disclosure, the control gate and select gate are non-overlapping.

In the foregoing specification, the disclosure has been described with references to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure includes using the process in the manufacture of embedded split-gate flash nanocrystal memory devices.

Further as discussed herein above, the embodiments include a select gate first process in which the bit cell select gates are formed prior to formation of the bit cell control gates. With the select gate first process, a first layer of polysilicon (poly 1) can be used for the bit cell select gates, as well as, be used for or shared with low voltage, high voltage and DGO (dual gate oxide) transistors of an integrated circuit being formed. A second layer of polysilicon (poly 2) is used for the control gates.

In yet another embodiment, the method includes a control gate first process in which the bit cell control gates are formed prior to formation of the bit cell select gates. With the control gate first process, a first polysilicon (poly 1) comprising a separate layer is used for low voltage, high voltage, and I/O transistors of an integrated circuit being formed, but not used for the bitcell itself. Rather, for the control gate first process, a second polysilicon (poly 2) is used in the formation of the bit cell control gates and a third polysilicon (poly 3) is used in the formation of the bit cell select gates.

In this latter embodiment (control gate first process), processing in substantially similar to that as discussed herein with reference to FIGS. 1-13 and FIGS. 14-24, with the following differences. In the control gate first embodiment, layer 14 and layer 56 of the select gate first embodiments are exchanged. That is, in the control gate first embodiment, the layer 14 of FIG. 1 would include a storage or memory layer (or stack of layers) formed overlying the substrate 12. The storage layer can comprise a stack of layers, wherein the stack of layers includes a non-volatile memory tunnel oxide layer, a layer of nanocrystals, and a top control oxide layer (all together illustrated as a single layer). In addition, the non-volatile memory tunnel oxide layer is grown using suitable techniques. The layer of nanocrystals is deposited using suitable techniques. Furthermore, the top control oxide layer can comprise a deposited oxide or a grown oxide, wherein the deposited oxide layer is formed using suitable oxide deposition techniques and the grown oxide layer is formed using suitable oxide growth techniques. In addition, for the control gate first embodiment, storage layer 56 of FIG. 3 would include an oxide layer overlying the patterned structure of FIG. 2, on exposed top surfaces and sidewalls. The other steps for the control gate first processing embodiment are similar to those as described in conjunction with FIGS. 1-13 and 14-24 and the select gate first processing embodiments, wherein (i) select gates of the select gate first process are replaced by control gates of the control gate first process and (ii) control gates of the select gate first process are replaced by select gates of the control gate first process.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a split gate memory cell using a semiconductor substrate, comprising: forming a first gate structure and a sacrificial structure over the semiconductor substrate, each of the first gate structure and the sacrificial structure including a nitride layer overlying the semiconductor substrate, wherein forming the first gate structure and the sacrificial structure includes forming an opening between the first gate structure and the sacrificial structure, wherein forming the first gate structure, the sacrificial structure, and the opening further includes using a single masking step which lithographically defines both (i) a gate length of the first gate structure and (ii) a gate length of a second gate structure yet to be formed, wherein the gate length of the second gate structure is lithographically defined by the opening; lining the opening with a layer; and filling the lined opening with a gate material of the second gate structure, wherein the first and second gate structures comprise one of (i) a select gate structure and a control gate structure, respectively, further wherein the layer comprises a storage layer and (ii) a control gate structure and a select gate structure, respectively, further wherein the layer comprises a dielectric layer; planarizing the gate material down to the nitride layer; thermally oxidizing an exposed top surface of the planarized gate material; and removing the sacrificial structure via a wet etch, wherein the thermally oxidized top surface of the planarized gate material protects underlying gate material during the wet etch removal of the sacrificial structure.

2. A method of claim 1, wherein the step of removing the sacrificial structure removes the sacrificial structure from over a source area in the semiconductor substrate, further comprising: implanting into the source area to form a source region in the semiconductor substrate.

3. The method of claim 2, further comprising providing a sidewall spacer around the source area prior to the step of implanting into the source area.

4. The method of claim 2, wherein the step of filling the opening comprises:
   depositing a layer of polysilicon; and
   chemical mechanical polishing the polysilicon layer.

5. The method of claim 1, further comprising siliciding a top surface of the select gate structure and a top surface of the control gate structure.

6. The method of claim 1, wherein the step of forming further comprises forming a sacrificial drain structure over a drain area of the semiconductor substrate adjacent to the select gate structure.

7. The method of claim 6 further comprising removing the sacrificial drain structure.

8. The method of claim 7, further comprising implanting into the drain area to form a drain region.

9. The method of claim 8, wherein the step of removing the sacrificial structure removes the sacrificial structure form over a source area in the semiconductor substrate further comprising: implanting into the source area to form a source region in the semiconductor substrate at a different time than the step of implanting into the drain region.

10. The method of claim 6, wherein the step of forming is further characterized as forming the sacrificial drain structure after the step of lining the opening.

11. The method of claim 6, wherein the step of forming is further characterized as forming the sacrificial drain structure before the step of lining the opening.

12. The method of claim 1, wherein the step of lining is further characterized by the storage layer comprising nanocrystals.

13. A method of forming a memory cell having a control gate, a select gate, a source, and a drain, comprising: providing a semiconductor substrate; forming a first gate structure and a first sacrificial structure over the semiconductor substrate, each of the first gate structure and the first sacrificial structure including a nitride layer overlying the semiconductor substrate, wherein forming the first gate structure and the first sacrificial structure includes forming an opening between the first gate structure and the first sacrificial structure, wherein forming the first gate structure, the first sacrificial structure, and the opening further includes using a single masking step which lithographically defines both (i) a gate length of the first gate structure and (ii) a gate length of a second gate structure yet to be formed, wherein the gate length of the second gate structure is lithographically defined by the opening; lining the opening with a layer; and forming the second gate structure in the opening after the step of lining, wherein the first and second gate structures comprise one of (i) a select gate and a control gate, respectively, further wherein the layer comprises a storage layer and (ii) a control gate and a select gate, respectively, further wherein the layer comprises a dielectric layer; planarizing a gate material of the second gate structure down to the nitride layer; thermally oxidizing an exposed top surface of the planarized gate material; removing the first sacrificial structure via a wet etch, wherein the thermally oxidized top surface of the planarized gate material protects underlying gate material during the wet etch removal of the first sacrificial structure; forming the source in the semiconductor substrate adjacent to the control gate; and forming the drain in the semiconductor substrate adjacent to the select gate.

14. The method of claim 13, wherein: the steps of forming the source comprises performing a first implant; the steps of forming the drain comprises performing a second implant at a different time than the first implant; and the step of lining the opening is further characterized as lining the opening with one selected from the group of (i) nanocrystals, in connection with the first gate structure comprising the select gate and the second gate structure comprising the control gate and (ii) dielectric, in connection with the first gate structure comprising the control gate and the second gate structure comprising the select gate.

15. A method of claim 14, further comprising: forming a second sacrificial structure over a source/drain area of the semiconductor substrate adjacent to the first gate structure; and removing the second sacrificial structure prior to the step of forming the source/drain in the source/drain area.

16. The method of claim 13 further comprising:
   siliciding a top surface of the source, a top surface of the drain, a top surface of the select gate, and a top surface of the control gate.

* * * * *

UNITED STATES PATENT AND TRADEMARK OFFICE
CERTIFICATE OF CORRECTION

| | | |
|---|---|---|
| PATENT NO. | : 7,524,719 B2 | Page 1 of 1 |
| APPLICATION NO. | : 11/469163 | |
| DATED | : April 28, 2009 | |
| INVENTOR(S) | : Steimle et al. | |

It is certified that error appears in the above-identified patent and that said Letters Patent is hereby corrected as shown below:

Column 13, line 2, in Claim 1, delete "protects" and insert -- protects the --.

Column 13, line 4, in Claim 2, delete "A" and insert -- The --.

Column 13, line 28, in Claim 9, delete "form" and insert -- from --.

Column 14, line 21, in Claim 13, delete "protects" and insert -- protects the --.

Column 14, line 26, in Claim 14, delete "steps" and insert -- step --.

Column 14, line 27, in Claim 14, delete "steps" and insert -- step --.

Column 14, line 37, in Claim 15, delete "A" and insert -- The --.

Signed and Sealed this
Sixteenth Day of August, 2011

David J. Kappos
*Director of the United States Patent and Trademark Office*